US 10,901,454 B2

(12) United States Patent
Mohanty et al.

(10) Patent No.: US 10,901,454 B2
(45) Date of Patent: Jan. 26, 2021

(54) CLOCK BUFFERING TO REDUCE MEMORY HOLD TIME

(71) Applicant: QUALCOMM Incorporated, San Diego, CA (US)

(72) Inventors: Shiba Narayan Mohanty, Bangalore (IN); Rakesh Kumar Sinha, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 77 days.

(21) Appl. No.: 16/269,428

(22) Filed: Feb. 6, 2019

(65) Prior Publication Data
US 2020/0249716 A1 Aug. 6, 2020

(51) Int. Cl.
G11C 8/00 (2006.01)
G06F 1/10 (2006.01)
G06F 3/06 (2006.01)
H03K 3/012 (2006.01)
H03K 3/3562 (2006.01)

(52) U.S. Cl.
CPC ............... G06F 1/10 (2013.01); G06F 3/064 (2013.01); G06F 3/0611 (2013.01); G06F 3/0656 (2013.01); G06F 3/0679 (2013.01); H03K 3/012 (2013.01); H03K 3/3562 (2013.01)

(58) Field of Classification Search
CPC .......... G06F 1/10; G06F 3/0611; G06F 3/064; G06F 3/0679; H03K 3/012; H03K 3/3562

USPC ........................................................ 365/233.1
See application file for complete search history.

(56) References Cited

U.S. PATENT DOCUMENTS

| 6,091,666 | A | * | 7/2000 | Arase | G11C 16/10 365/189.05 |
|---|---|---|---|---|---|
| 6,959,016 | B1 | | 10/2005 | Keeth et al. | |
| 7,668,037 | B2 | | 2/2010 | Carpenter et al. | |
| 9,088,279 | B2 | | 7/2015 | Fleischer et al. | |
| 9,362,899 | B2 | | 6/2016 | Kuo et al. | |
| 9,362,910 | B2 | | 6/2016 | Gurumurthy et al. | |
| 2004/0047230 | A1 | | 3/2004 | Mizuhashi | |
| 2008/0012618 | A1 | | 1/2008 | Ramaraju et al. | |
| 2008/0218234 | A1 | * | 9/2008 | Jain | H03K 19/0013 327/202 |
| 2008/0298142 | A1 | * | 12/2008 | Chen | G11C 7/222 365/194 |
| 2017/0076760 | A1 | | 3/2017 | Yabuuchi | |

OTHER PUBLICATIONS

International Search Report and Written Opinion—PCT/US2020/016836—ISA/EPO— dated May 28, 2020.

* cited by examiner

Primary Examiner — Huan Hoang
(74) Attorney, Agent, or Firm — Haynes and Boone, LLP

(57) ABSTRACT

A memory is provided with a logic gate that processes a first version and a second version of a memory clock signal to assert a clock signal for the clocking of latches in a second array of columns for the memory. The first version clocks the latches in a first array of columns for the memory. But the second version does not clock any latches in the first array of columns.

19 Claims, 6 Drawing Sheets

CLOCK BUFFERING TO REDUCE MEMORY HOLD TIME

TECHNICAL FIELD

This application relates to the clocking of memories, and more particularly to a clock buffering that reduces memory hold times.

BACKGROUND

The bitcells for memories are conventionally arranged into rows and columns. The rows correspond to the word lines whereas the columns correspond to the bit lines. Depending upon the memory width and column multiplexing, a memory may have a substantial number of columns. But such a relatively large number of columns loads the memory clock signal. To address the memory clock signal loading, the columns are arranged into arrays with the memory clock signal being buffered back up in strength as it passes from one array to another.

An example of such clock buffering or repeating is shown in FIG. 1A for a conventional memory 100 having two arrays of columns 155. Each column 155 is driven by a corresponding data signal (Din). There is thus a Din<0> signal for a zeroth column 155, a Din<1> signal for the first column (not illustrated), and so on. A first array of columns ranges from the zeroth column 155 to a sixty-fourth column 155 driven by a corresponding Din<63> data signal. A second array of columns ranges from a sixty-fifth column 155 driven by a corresponding Din<65> data signal to a one-hundred-twenty-eighth column 155 that receives a Din<127> data signal. For each column 155, a corresponding input circuit 115 includes a master-slave flip-flop that latches the column's data signal in response to the memory clock signal (bclk). For example, a master-slave flip-flop 120 latches the zeroth data signal Din <0> for the zeroth column. In this column, an inverter 125 inverts a memory clock signal bclk to produce a master latch clock signal bclk2 for clocking the master latch in master-slave flip-flop 120. Similarly, an inverter 130 inverts the master latch clock signal bclk2 to produce a slave latch clock signal bclk3 for clocking the slave latch in master-slave flip-flop 120. The remaining columns in memory 100 each have an analogous arrangement of a master-slave flip-flop and inverters for latching their data signals.

The memory clock signal bclk is heavily resistor-capacitor (RC) loaded by driving so many master-slave flip-flops in the first array. To restore the memory clock signal strength, it is buffered in a clock repeater 135 by a pair of inverters 140 to produce a buffered memory clock signal bclk_buf that drives the master-slave flip-flops in the second array of columns. But the buffering of the memory clock signal bclk_buf in repeater 135 introduces delay. This delay is exacerbated by the RC loading from all the master/slave flip-flops that the buffered clock signal must drive. The hold time for the data signal must thus be increased to ensure that the data signals driving the second array of columns are properly captured by the corresponding master/slave flip-flops.

To address this hold time issue, it is known to programmably delay the data signals going to the flops clocked by the buffered clock signal in the second array of columns as shown in FIG. 1B for a memory 150. Memory 150 is arranged as discussed with regard to memory 100 except that the programmable delay circuits 145 delay the data signals for the second array of columns. The delay provided by the programmable delay circuits 145 reduces the hold time requirements for the data signal despite the delayed clocking of the master-slave flip-flops in the second array of columns. But such programmable delay demands substantial die space and consumes power.

Accordingly, there is a need in the art for memories with improved clock buffering (clock repeating).

SUMMARY

A clock generator generates a memory clock signal to trigger the clocking of a first array of columns and of a second array of columns. In particular, each column includes an input circuit having a latch for latching a corresponding data signal. The clocking triggers the latch to latch the corresponding data signal. But this clocking for all the various columns in an array subjects the memory clock signal to significant RC loading. To prevent the resulting delay from increasing the hold time for the second array of columns, a logic gate is introduced for the clocking of the second array of columns. To trigger the logic gate to assert a clock signal for the clocking of the second array of columns, the logic gate receives two versions of a memory clock signal. A first version is a buffered version of the memory clock signal that drives the first array of columns and is thus subject to RC loading. A second version of the memory clock signal does not drive any of the columns in the first array so it does not have such RC loading. A triggering edge for the second version of the memory clock signal can thus propagate relatively quickly to the logic gate to trigger the logic gate to assert the memory clock signal for the second array of columns. In this fashion, the second array of columns may be clocked without any delay due to the RC loading from the clocking of the first array of columns. The hold time for the data signals to the second array may thus be reduced accordingly.

These and other advantageous features may be better appreciated through the following detailed description.

Implementations of the present disclosure and their advantages are best understood by referring to the detailed description that follows. It should be appreciated that like

DETAILED DESCRIPTION

To address the need for improved memory clock buffering, a first memory clock signal drives a first array of columns but is not repeated to drive any additional column arrays. The first memory clock signal is generated responsive to a system clock signal. A second memory clock signal is also generated responsive to the system clock signal. This second memory clock signal does not drive any of the columns in the first array and is thus not subject to the resistor-capacitor (RC) loading experienced by the first memory clock signal due to its driving of the columns in the first memory array. A logic gate processes the first and second memory clock signals to produce a third memory clock signal. It is the third memory clock signal that drives a second array of columns in the memory. But since the second memory clock signal is not loaded by the driving of the first array of columns, a triggering edge of the second memory clock signal can trigger the logic gate to assert the third memory clock relatively quickly. The write data bits for the second array of columns thus do not need excessive hold times despite the propagation of the second memory clock signal across the first array of columns to trigger the logic gate. When the first memory clock signal is de-asserted following the latching of the write data for the first array of columns, the logic gate de-asserts the third memory clock signal. Some example embodiments will now be discussed in more detail.

Figure 1A:
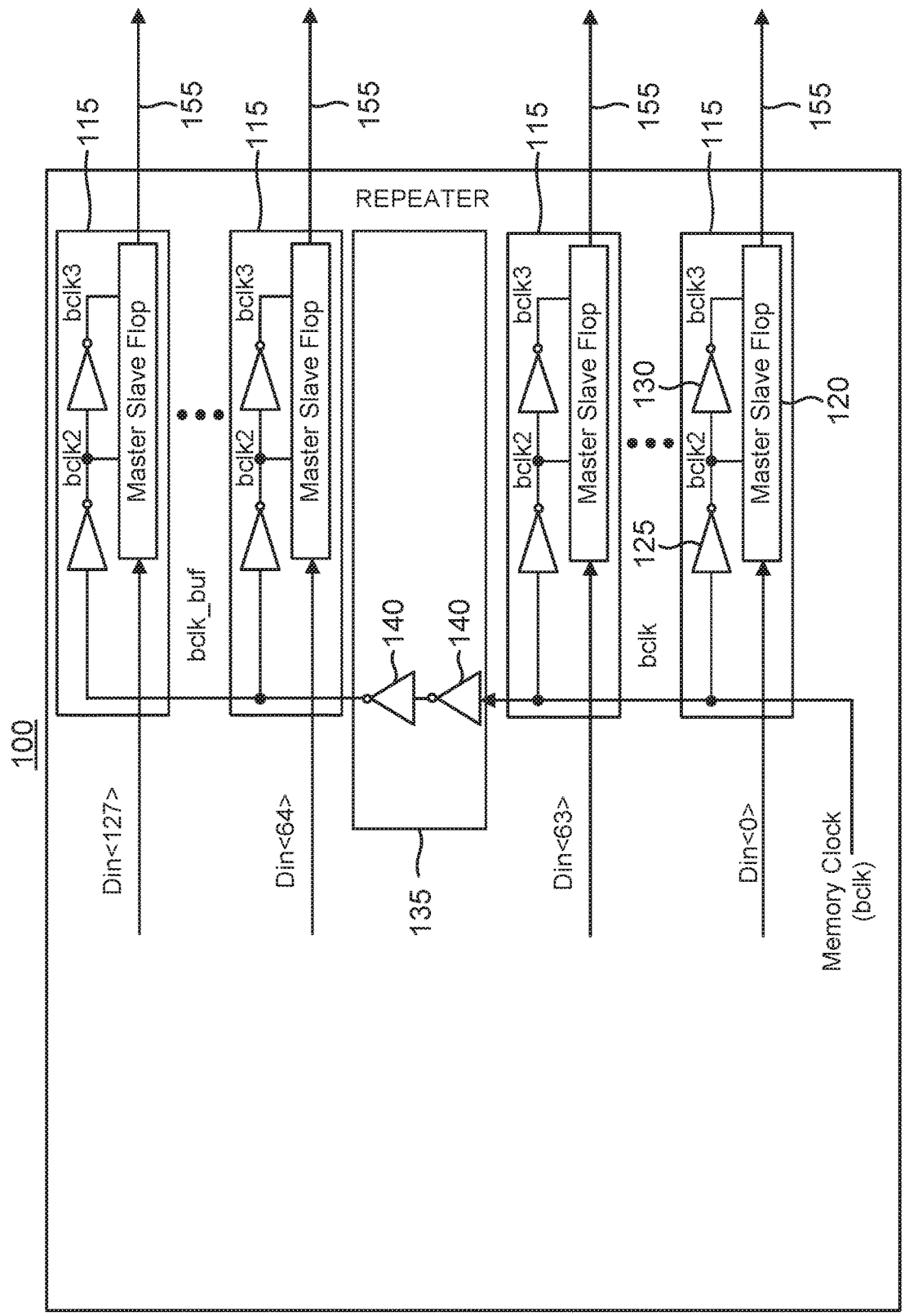
FIG. 1A illustrates a conventional memory in which the memory clock signal is buffered by a clock repeater for driving a second array of columns.
Figure 1B:
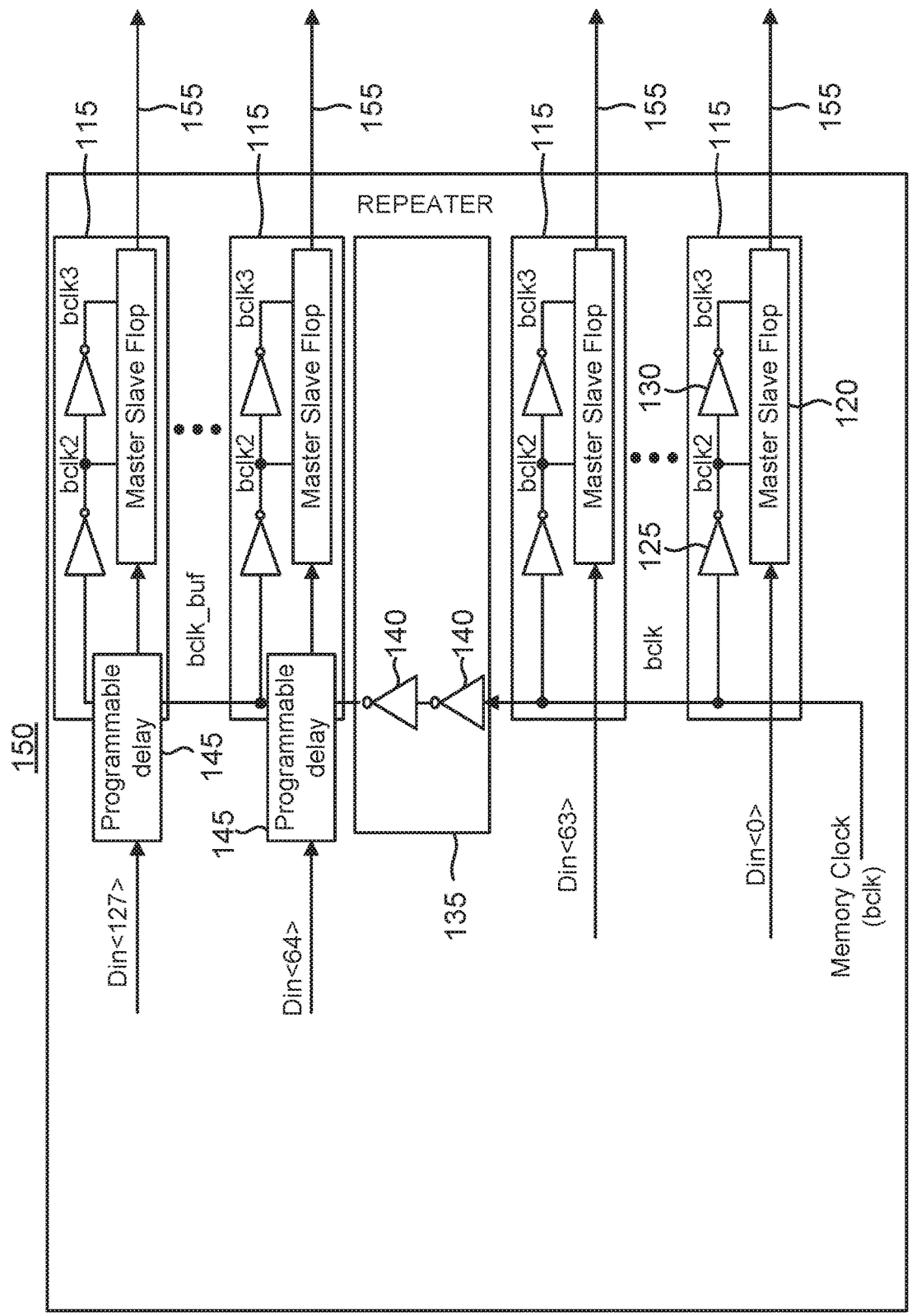
FIG. 1B illustrates a conventional memory in which the memory clock signal is buffered by a clock repeater as in FIG. 1A but also the second array of columns include programmable delay circuits for delaying the data signals to the second array of columns.
Figure 2A:
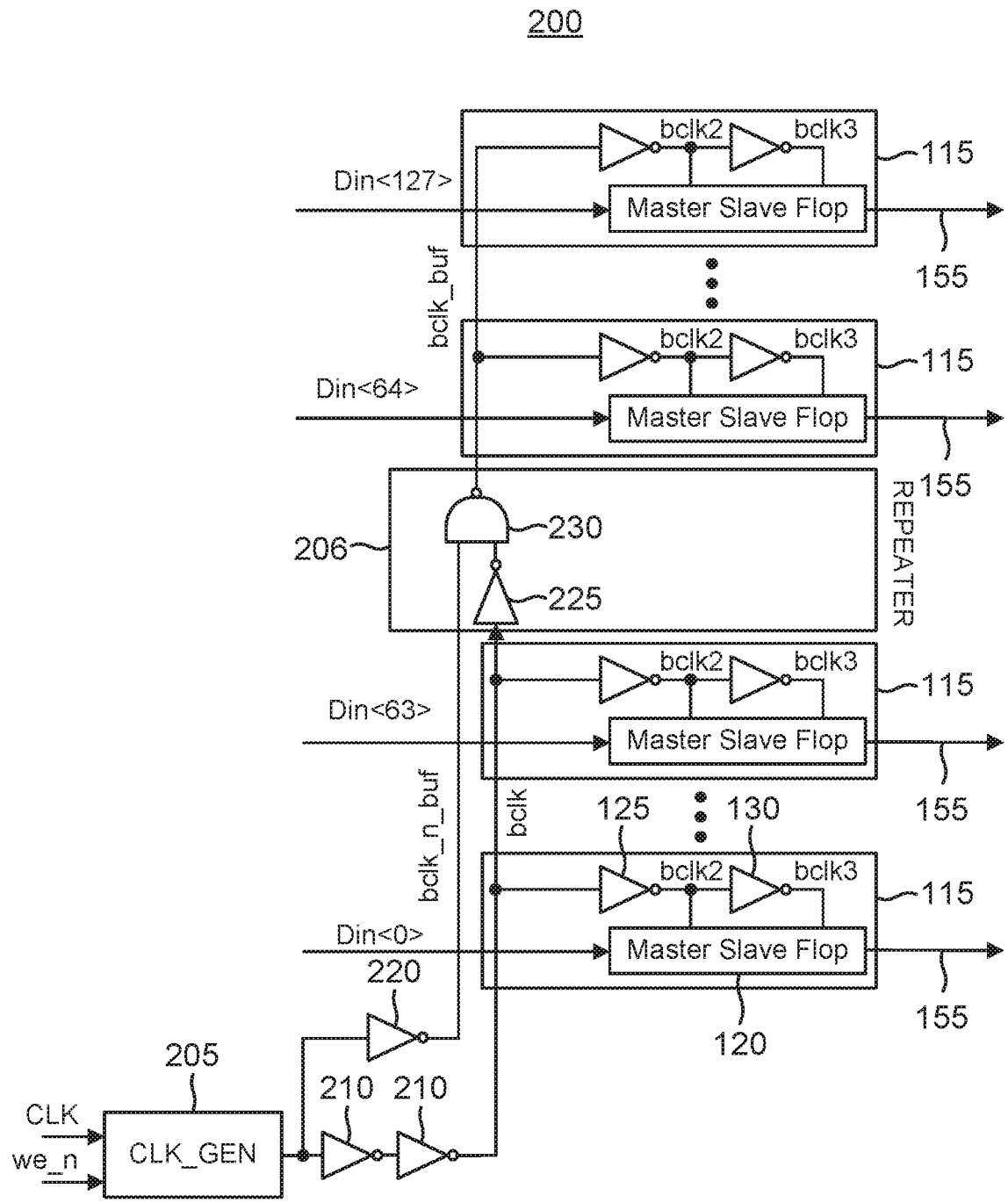
FIG. 2A illustrates a memory in which the memory clock signal is buffered with a NAND logic gate for improved clocking speed of an array of columns in accordance with an aspect of the disclosure.

An example memory 200 is shown in FIG. 2A. A clock generator (CLK_GEN) 205 receives a system clock signal CLK to generate a memory clock signal when a clock enable signal (we_n) is asserted). A pair of inverters 210 buffer the memory clock signal to form a first buffered memory clock signal (bclk) the drives a first array of columns ranging from a zeroth column 155 to a sixty-fourth column 155. Each first array column 155 includes a master-slave flip-flop for latching a corresponding input data signal responsive to the first buffered memory clock signal bclk. For example, a master-slave flip-flop 120 latches the zeroth data signal Din <0> for the zeroth column 155 as previously discussed with regard to memory 100. In the zeroth column 155, an inverter 125 inverts the first buffered memory clock signal bclk to produce a master latch clock signal bclk2 for clocking the master latch in master-slave flip-flop 120. Similarly, an inverter 130 inverts the master latch clock signal bclk2 to produce a slave latch clock signal bclk3 for clocking the slave latch in master-slave flip-flop 120. The remaining columns in memory 200 each have an analogous arrangement of a master-slave flip-flop and inverters for latching their data signals. The collection of master-slave flip-flop 120 and inverters 125 and 130 form an input circuit 115 for the latching of the data signal for each column 155.

Since the first buffered memory clock signal bclk drives sixty-four inverters 125 for the sixty-four columns 155 in the first array, the first buffered memory clock signal bclk is subject to considerable RC loading. To avoid the delay that this RC loading would cause with regard to driving the second array of columns, an inverter 220 inverts the memory clock signal from clock generator 205 to produce a first inverted memory clock signal (bclk_n_buf). This first inverted memory clock signal bclk_n_buf does not drive any of the inverters 125 in the first array of columns but instead propagates on a dedicated lead to a logic gate such as a NAND gate 230 in a clock repeater circuit 206. An inverter 225 in clock repeater circuit 206 inverts the first buffered memory clock signal bclk to produce a second inverted memory clock signal that also drives NAND gate 230. An output of NAND gate 230 forms a second buffered memory clock signal (bclk_n) for clocking the second array of columns 155.

During a default, non-asserted state for the memory clock signal from clock generator 205, both the first inverted memory clock signal bclk_n_buf and the second inverted memory clock signal will be asserted high to a power supply voltage. NAND gate 230 would then be processing a pair of binary one signals such that second buffered clock signal bclk_buf is de-asserted (grounded). In response to a rising edge in the memory clock signal from clock generator 205, the first inverted memory clock signal bclk_n_buf will go low before the second inverted memory clock signal does due to the RC delay for the first buffered clock signal bclk. The falling edge for the first inverted memory clock signal bclk_n_buf propagates relatively quickly on its dedicated lead from inverter 220 to NAND gate 230. The second buffered memory clock signal bclk_buf will thus be asserted to drive the second array of columns 155 nearly simultaneously with the assertion of the first buffered memory clock signal bclk. This is quite advantageous with respect to minimizing the hold time for the data signals driving the second array of columns 155.

In response to the falling edge for the memory clock signal from clock generator 205, the first inverted memory clock signal bclk_n_buf will be asserted high relatively quickly compared to the second inverted memory clock signal. The second inverted memory clock signal will then be asserted following the falling edge for the first buffered memory clock signal bclk. It is this assertion of the second inverted memory clock signal that controls the falling edge for the second buffered memory clock signal bclk_buf. But this delay in de-asserting the second buffered memory clock signal bclk_buf has no effect on the data hold time since the master latches in the second array of columns 155 will have already been triggered by the preceding assertion of the second buffered memory clock signal bclk_buf. Memory 200 may thus be driven at relatively high speeds since there are no significant hold time issues for the second array's data signals. Moreover, this high-speed operation for memory 200 is relatively dense and low-power compared to the conventional use of programmable delay circuits for the second array's data signals.

Figure 2B:
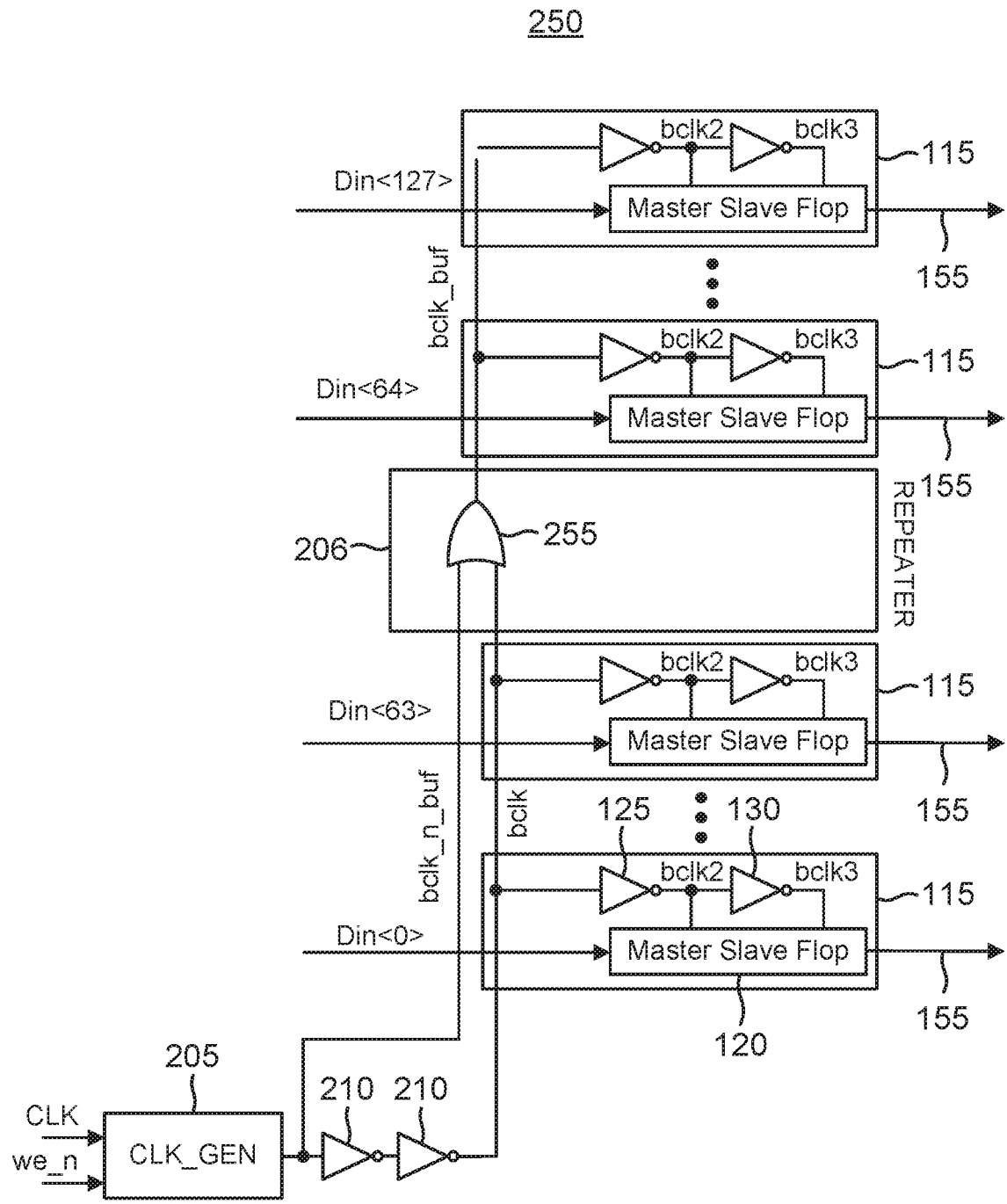
FIG. 2B illustrates a memory in which the memory clock signal is buffered with an OR logic gate for improved clocking speed of an array of columns in accordance with an aspect of the disclosure.

Other types of logic gates may be used to generate the second buffered memory clock signal bclk_buf for clocking the second array of columns 155. For example, a memory 250 shown in FIG. 2B includes an OR gate 255 for generating the second buffered memory clock signal bclk_buf. OR gate 255 ORs the memory clock signal from clock generator 205 and the first buffered memory clock signal bclk to generate the second buffered memory clock signal bclk_buf. The rising edge for the memory clock signal from clock generator 205 will propagate relatively quickly over the dedicated lead between clock generator 205 and OR gate 255 so that the second buffered memory clock signal bclk_buf can be asserted substantially simultaneously with the assertion of the first buffered memory clock signal bclk. Except for the absence of NAND gate 230 and inverters 220 and 225, the remaining components of memory 250 are as discussed for memory 200. Comparing memories 200 and 300, it may be seen that logic gates 230 and 255 respond to two versions of the memory clock signal from clock generator 205. A first version of this clock (first buffered memory clock signal bclk) drives the columns in the first array and is thus RC loaded. A second version of the clock signal (either first inverted memory clock signal bclk_n_buf or the memory clock signal itself) propagates on a dedicated lead to the logic gate without driving any columns in the first array so that the logic gate may respond to this relatively rapid propagation and assert the second buffered memory clock signal bclk_buf.

Figure 3:
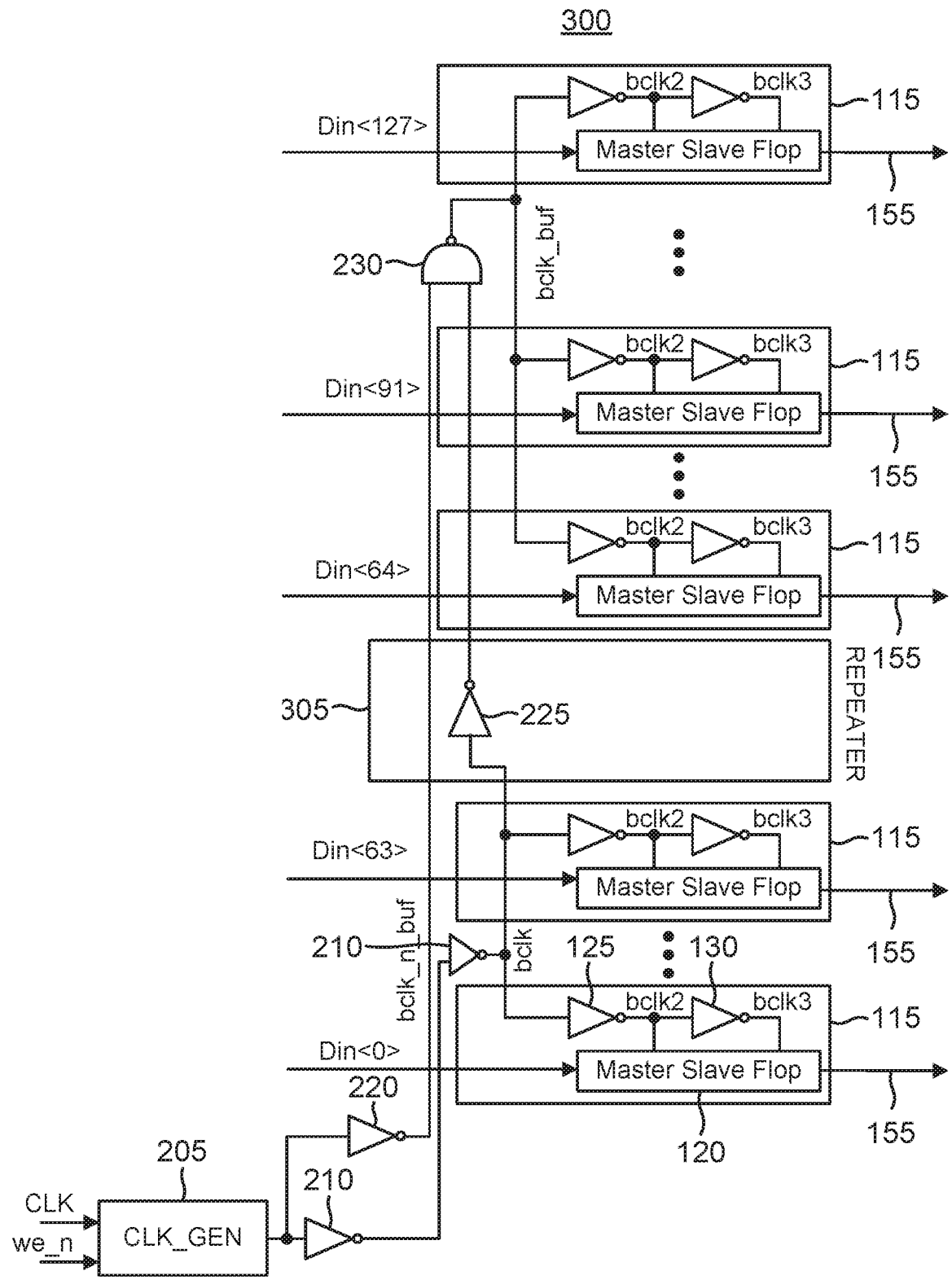
FIG. 3 illustrates a modification of the memory of FIG. 2A in which the NAND logic gate is located centrally within the array of columns to further improve the clocking speed in accordance with an aspect of the disclosure.

The logic gate such as NAND gate 230 or OR gate 255 functions as the clock generator for the second array of columns 155. Since NAND gate 230 is located centrally between the two arrays in clock repeater circuit 206, it takes relatively little time for the second buffered memory clock signal bclk_buf to propagate to the sixty-fourth column 155 in the second array. But it takes a relatively longer time for the second buffered memory clock signal bclk_buf to propagate across the second array of columns 155 to reach the final one-hundred-twenty-eighth column 155. This propagation delay affects the data hold time since the data input signal Din<127> needs to be held sufficiently for when the rising edge of the second buffered memory clock signal bclk_buf reaches this final column 155. To further reduce the hold time, NAND gate 230 may be centrally located within the second array of columns 155 as shown in FIG. 3 for a memory 300. In memory 300, NAND gate 230 is located between the 95$^{th}$ and 96$^{th}$ columns (not illustrated). There is thus an equal propagation delay from traversing thirty-two columns for the second buffered memory clock signal bclk_buf to propagate from NAND gate 230 to the sixty-fourth and the hundred-twenty-eighth columns 155. In this fashion, the propagation delay that contributes to the hold time for the second array is reduced to a minimum. A clock repeater 305 in memory 300 includes just inverter 225. The final inverter 210 for producing the buffered clock signal bclk may also be centrally located for the first array of columns such that this final inverter 210 is located between the 31$^{st}$ and 32$^{nd}$ columns (these columns are not shown in FIG. 3 for illustration clarity). The clock propagation delay to the first array of columns is thus also minimized by such an inverter location. The remaining components in memory 30X) are as discussed with regard to memory 200. It will be appreciated that NAND gate 230 may be replaced by OR gate 255 with regard to such centralization within the second array of columns.

Figure 4:
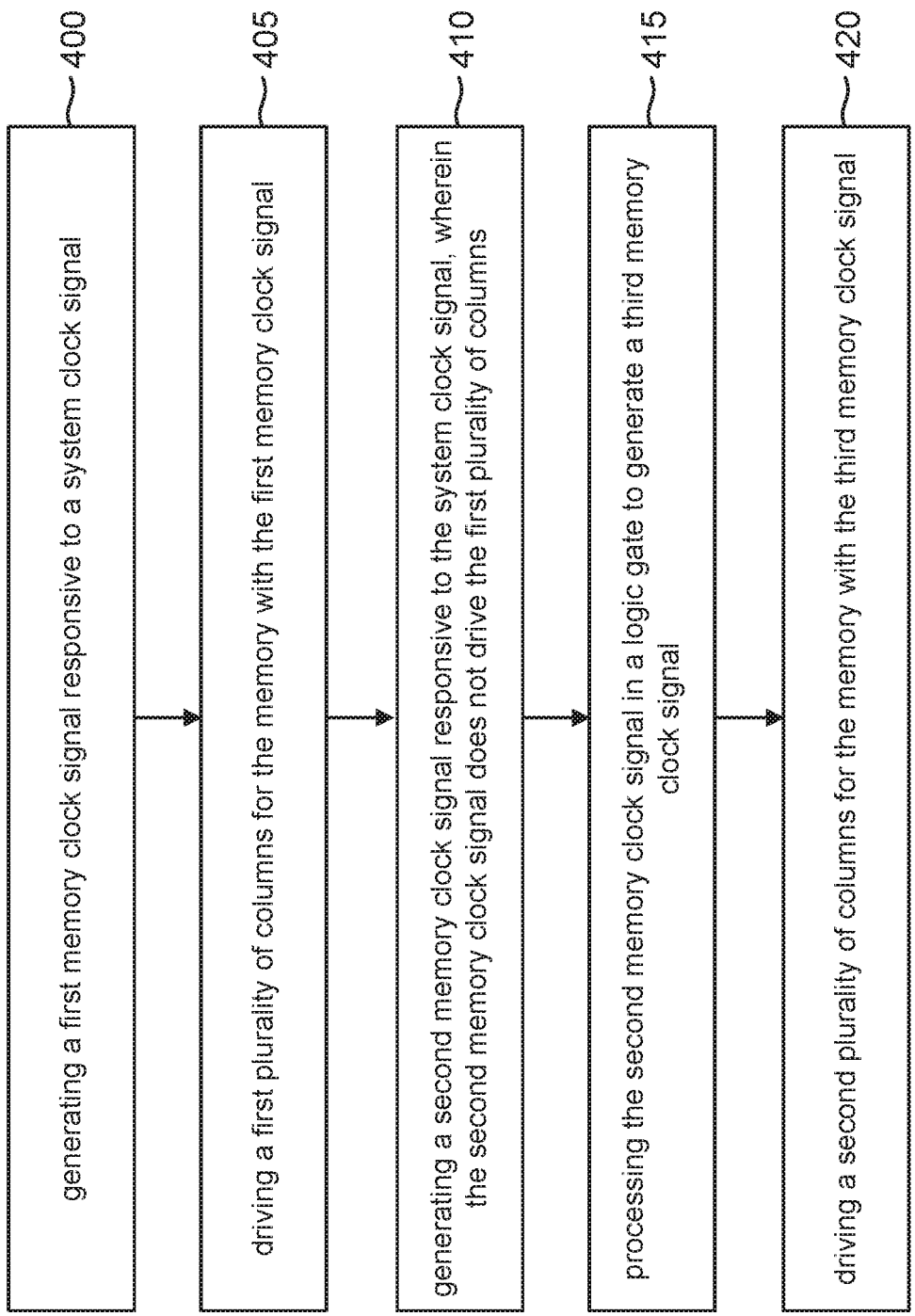
FIG. 4 is a flowchart of a method for faster clocking of multiple arrays of columns in a memory in accordance with an aspect of the disclosure.

A method of clocking a memory will now be discussed with regard to the flowchart of FIG. 4. The method includes an act 400 of generating a first memory clock signal responsive to a system clock signal. The generation of first buffered memory clock signal bclk in memories 200 and 300 is an example of act 400. The method also includes an act 405 of driving a first plurality of columns for the memory with the first memory clock signal. The driving of inverters 125 in the first array of columns 155 by the first buffered memory clock signal bclk for memories 200 and 300 is an example of act 405. In addition, the method includes an act 410 of generating a second memory clock signal responsive to the system clock signal, wherein the second memory clock signal does not drive the first plurality of columns. The generation of the first inverted memory clock signal bclk_n_buf for memories 200 and 300 is an example of act 410. Moreover, the method includes an act 415 of processing the second memory clock signal in a logic gate to generate a third memory clock signal. The triggering of NAND gate 230 to assert the second buffered memory clock signal bclk_buf responsive to the falling edge of the first inverted memory clock signal bclk_n_buf for memories 200 and 300 is an example of act 415. Finally, the method includes an act 420 of driving a second plurality of columns for the memory with the third memory clock signal. The driving of inverters 125 by the second buffered memory clock signal bclk_buf in the second array of columns for memories 200) and 300 is an example of act 420.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A memory, comprising:
a clock generator for generating a first memory clock signal;
a first array of columns, each column in the first array of columns including a first latch for latching a data signal for the column, wherein each first latch is configured to be clocked by a first version of the first memory clock signal;
a logic gate configured to process the first version of the first memory clock signal with a second version of the memory clock signal that is not loaded by each first latch to generate a second memory clock signal; and
a second array of columns, each column in the second array of columns including a second latch for latching a data signal for the column, wherein each second latch is configured to be clocked by the second memory clock signal from the logic gate.

2. The memory of claim 1, further comprising:
a clock buffer for buffering the first memory clock signal to form the first version of the first memory clock signal.

3. The memory of claim 1, further comprising:
an inverter for inverting the first memory clock signal to form the second version of the first memory clock signal.

4. The memory of claim 1, wherein the logic gate is a NAND gate.

5. The memory of claim 1, wherein the logic gate is an OR gate.

6. The memory of claim 1, wherein the memory is a static random access memory (SRAM).

7. The memory of claim 1, wherein each latch is a master-slave latch.

8. The memory of claim 1, wherein the clock generator is configured to generate the first memory clock signal responsive to a system clock signal.

9. The memory of claim 8, wherein the clock generator is further configured to generate the first memory clock signal responsive to a write enable signal.

10. A method of clocking a memory, comprising:
generating a first memory clock signal responsive to a system clock signal;
clocking a first plurality of columns for the memory with the first memory clock signal;
generating a second memory clock signal responsive to the system clock signal, wherein the second memory clock signal does not clock the first plurality of columns;
processing the second memory clock signal and the first memory clock signal in a logic gate to generate a third memory clock signal; and clocking a second plurality of columns for the memory with the third memory clock signal.

11. The method of claim 10, further comprising:
generating an output memory clock signal responsive to the system clock signal, wherein the generating of the first memory clock signal comprises buffering the output memory clock signal to form the first memory clock signal.

12. The method of claim 11, wherein the generating of the second memory clock signal comprises inverting the output memory clock signal to form the second memory clock signal.

13. The method of claim 10, wherein the processing of the second memory clock signal with the first memory clock signal in the logic gate comprises processing the second memory clock signal with the first memory clock signal in a NAND gate.

14. The method of claim 10, wherein the processing of the second memory clock signal with the first memory clock signal in the logic gate comprises processing the second memory clock signal with the first memory clock signal in an OR gate.

15. A memory comprising:
a first array of columns, each column in the first array of columns including a first latch for latching a corresponding data signal;
a second array of columns, each column in the second array of columns including a second latch for latching a corresponding data signal;
a clock generator configured to generate a memory clock signal;
a clock buffer configured to buffer the memory clock signal to form a first buffered memory clock signal for a clocking of each first latch in the first array of columns; and
a logic gate configured to process the first buffered memory clock signal and a version of the memory clock signal that is not loaded by the clocking of each first latch to generate a second memory clock signal for a clocking of each second latch.

16. The memory of claim 15, further comprising:
an inverter for inverting the memory clock signal to form the version of the memory clock signal, wherein the logic gate comprises
a NAND gate configured to NAND the inverted memory clock signal with the first buffered memory clock signal to form a second buffered memory clock signal, wherein each latch in the second array of columns is configured to be clocked by the second buffered memory clock signal.

17. The memory of claim 16, wherein the NAND gate is centrally located within the second array of columns.

18. The memory of claim 15,
wherein the logic gate comprises an OR gate.

19. The memory of claim 18, wherein the OR gate is centrally located within the second array of columns.

* * * * *